U S011375623B2

(12) United States Patent
Na et al.

(10) Patent No.: US 11,375,623 B2
(45) Date of Patent: Jun. 28, 2022

(54) BATTERY PROTECTION CIRCUIT PACKAGE AND METHOD OF FABRICATING THE SAME

(71) Applicant: ITM SEMICONDUCTOR CO., LTD., Chungcheongbuk-do (KR)

(72) Inventors: Hyuk Hwi Na, Chungcheongbuk-do (KR); Ho Seok Hwang, Gyeonggi-do (KR); Young Seok Kim, Chungcheongbuk-do (KR); Sang Hoon Ahn, Chungcheongbuk-do (KR); Jae Ku Park, Chungcheongbuk-do (KR); Sung Hee Wang, Chungcheongbuk-do (KR); Eun Bin Lee, Chungcheongbuk-do (KR)

(73) Assignee: ITM SEMICONDUCTOR CO., LTD., Chungcheongbuk-Do (KR)

( * ) Notice: Subject to any disclaimer, the term of this patent is extended or adjusted under 35 U.S.C. 154(b) by 249 days.

(21) Appl. No.: 16/907,474

(22) Filed: Jun. 22, 2020

(65) Prior Publication Data

US 2021/0014976 A1 Jan. 14, 2021

(30) Foreign Application Priority Data

Jul. 11, 2019 (KR) .................. 10-2019-0084062

(51) Int. Cl.
*H05K 3/34* (2006.01)
*H01M 50/572* (2021.01)
(Continued)

(52) U.S. Cl.
CPC ....... *H05K 3/341* (2013.01); *H01L 23/49575* (2013.01); *H01M 10/425* (2013.01);
(Continued)

(58) Field of Classification Search
CPC ........ H05K 3/341; H05K 1/118; H05K 3/284; H01M 50/572; H01M 10/425;
(Continued)

(56) References Cited

U.S. PATENT DOCUMENTS 9,564,406 B1 * 2/2017 Niu .................... H01L 21/78
11,018,381 B2 * 5/2021 Dawley ................ H05K 1/147
(Continued)

FOREIGN PATENT DOCUMENTS

CN 113659185 A * 11/2021 .............. H05K 1/14
EP 3770994 A1 * 1/2021 ........... G01R 31/364
(Continued)

*Primary Examiner* — Suresh Memula
(74) *Attorney, Agent, or Firm* — Stuart H. Mayer; Mayer & Williams PC

(57) ABSTRACT

A method of fabricating a battery protection circuit package according to one aspect of the present invention includes forming a first mounting structure by mounting battery protection circuit elements on a printed circuit board (PCB), forming a second mounting structure by mounting the first mounting structure on a lead frame which comprises an input/output terminal portion for external connection and at least one metal tab for battery cell connection, forming an encapsulation structure by encapsulating the second mounting structure with a molding material to encapsulate at least a part of the battery protection circuit elements while exposing the input/output terminal portion and the at least one metal tab of the lead frame, and bonding at least one flexible printed circuit board (FPCB) to the input/output terminal portion of the encapsulation structure.

16 Claims, 6 Drawing Sheets

(51) Int. Cl.
    *H01L 23/495*     (2006.01)
    *H01M 10/42*     (2006.01)
    *H02J 7/00*     (2006.01)
    *H05K 1/11*     (2006.01)
    *H05K 3/28*     (2006.01)

(52) U.S. Cl.
    CPC ......... *H01M 50/572* (2021.01); *H02J 7/0029* (2013.01); *H02J 7/0042* (2013.01); *H05K 1/118* (2013.01); *H05K 3/284* (2013.01); *H01M 2200/00* (2013.01)

(58) Field of Classification Search
    CPC .......... H01M 2200/00; H01L 23/49575; H02J 7/0029; H02J 7/0042
    USPC ......................................................... 361/748
    See application file for complete search history.

(56) References Cited

U.S. PATENT DOCUMENTS

| | | | | |
|---|---|---|---|---|
| 11,058,013 | B2* | 7/2021 | Dawley | H01R 43/0256 |
| 2009/0322149 | A1 | 12/2009 | Kishibata | |
| 2014/0347776 | A1 | 11/2014 | Na | |
| 2015/0004439 | A1 | 1/2015 | Kim | |
| 2016/0141594 | A1* | 5/2016 | Hwang | H01M 50/581 |
| | | | | 429/7 |
| 2016/0164146 | A1* | 6/2016 | Na | H01L 23/49593 |
| | | | | 257/676 |
| 2017/0118838 | A1* | 4/2017 | Williams | H05K 1/148 |
| 2018/0048167 | A1 | 2/2018 | Tanaka | |
| 2018/0190960 | A1* | 7/2018 | Harris | H01M 10/482 |
| 2020/0176748 | A1* | 6/2020 | Katase | H01M 10/425 |
| 2020/0274204 | A1* | 8/2020 | Dawley | H01M 50/502 |
| 2020/0275555 | A1* | 8/2020 | Dawley | H05K 3/328 |
| 2021/0028513 | A1* | 1/2021 | Cho | H01M 10/482 |
| 2021/0091360 | A1* | 3/2021 | Balaram | H01M 10/425 |
| 2021/0242543 | A1* | 8/2021 | Balaram | H01M 50/533 |
| 2021/0368631 | A1* | 11/2021 | Na | H05K 1/14 |
| 2022/0104344 | A1* | 3/2022 | Yamada | H05K 3/125 |

FOREIGN PATENT DOCUMENTS

| | | | | |
|---|---|---|---|---|
| JP | 2006187185 | A | 7/2006 | |
| JP | 2010010468 | A | 1/2010 | |
| JP | 2014535133 | A | 12/2014 | |
| JP | 2015011999 | A | 1/2015 | |
| JP | 2018026982 | A | 2/2018 | |
| KR | 1020090117315 | | 11/2009 | |
| KR | 1020140079585 | | 6/2014 | |
| KR | 1014793070000 | | 12/2014 | |
| KR | 1020160039790 | | 4/2016 | |
| WO | WO-2015002401 | A1* | 1/2015 | .......... H01M 10/425 |
| WO | WO-2019066441 | A1* | 4/2019 | ............ H01M 10/42 |

\* cited by examiner

BATTERY PROTECTION CIRCUIT PACKAGE AND METHOD OF FABRICATING THE SAME

CROSS-REFERENCE TO RELATED APPLICATION(S)

This application claims the benefit of Korean Patent Application No. 10-2019-0084062, filed on Jul. 11, 2019, in the Korean Intellectual Property Office, the entire disclosure of which is incorporated herein by reference for all purposes.

BACKGROUND

1. Field

The following description relates to a battery, and more particularly, to a battery protection circuit package and a method of fabricating the same.

2. Description of Related Art

In general, batteries are used for electronic devices, such as mobile phones, personal digital assistants (PDAs), and the like. Lithium-ion batteries are the most widely used batteries for portable terminals, etc. They generate heat during overcharging and overcurrent conditions, and if the temperature rises as the heat continues to be generated, there is a risk of explosion as well as performance degradation. Therefore, in order to prevent such performance degradation, there is an increasing need to provide the battery with a battery protection circuit device that blocks the operation of the battery.

Accordingly, a typical battery is equipped with a protection circuit module that detects and blocks overcharge, overdischarge, and overcurrent, or a protection circuit that detects overcharge, overdischarge, and heat outside the battery and blocks the operation of the battery is installed for use in the battery. In recent years, miniaturization of a battery pack and securing of stability have emerged as important technical issues.

Prior Art Document

Patent Document (Patent Document 1) 1. Korean Patent Publication No. 10-2009-0117315 (Publication date: Nov. 12, 2009, title of invention: battery pack)

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

Recently, as a flexible substrate is used in a battery protection circuit in addition to a rigid substrate, there is a need to increase an operation speed and heat radiation properties by lowering resistance thereof.

Thus, the present invention is devised to address the aforementioned issues and an objective of the present invention is to provide a flexible substrate-coupled battery protection circuit package capable of high-speed operation and a method of fabricating the same. However, the objective is exemplary, and the scope of the present invention is not limited thereto.

In one general aspect, there is provided a method of fabricating a battery protection circuit package including forming a first mounting structure by mounting battery protection circuit elements on a printed circuit board (PCB), forming a second mounting structure by mounting the first mounting structure on a lead frame which comprises an input/output terminal portion for external connection and at least one metal tab for battery cell connection, forming an encapsulation structure by encapsulating the second mounting structure with a molding material to encapsulate at least a part of the battery protection circuit elements while exposing the input/output terminal portion and the at least one metal tab of the lead frame, and bonding at least one flexible printed circuit board (FPCB) to the input/output terminal portion of the encapsulation structure.

The forming of the first mounting structure may include mounting the battery protection circuit elements on the PCB using a surface mounting technology (SMT).

The at least one metal tab may include at least one metal tap formed to protrude from a side of the lead frame.

The lead frame and the at least one metal tab may be integrally formed.

The lead frame and the at least one metal tab may be made of copper (Cu) or nickel (Ni).

The input/output terminal portion may include at least one pair of input/output terminal portions disposed at both ends of the lead frame and the lead frame may further include at least one current path portion that extends in a longitudinal direction to connect the pair of input/output terminal portions and is connected to input/output pads of the PCB to allow current flow through the PCB and parallel current flow.

The at least one current path portion may include one pair of current path portions spaced apart from each other and the at least one pair of input/output terminal portions may include two pairs of input/output terminal portions connected to ends of the one pair of current path portions.

The forming of the second mounting structure may include mounting the first mounting structure on the lead frame using an SMT.

The method may further include, prior to the encapsulating, underfilling at least a part of junctions of the battery protection circuit elements mounted on the PCB with an epoxy.

The bonding may include bonding a pair of FPCBs to both ends of the lead frame of the second mounting structure.

The method may further include, after the bonding, bending at least a part of the FPCB.

In another general aspect, there is provided a battery protection circuit package including a lead frame configured to comprise an input/output terminal portion for external connection and at least one metal tab for battery cell connection, a PCB mounted on the lead frame, battery protection circuit elements mounted on the PCB, a molding material configured to encapsulate at least a part of the battery protection circuit elements while exposing the input/output terminal portion and the at least one metal tab of the lead frame, and at least one FPCB bonded to the input/output terminal portion of the lead frame.

The input/output terminal portion may include at least one pair of input/output terminal portions disposed at each ends of the lead frame and the lead frame may further include at least one current path portion which extends in a longitudinal direction to connect the one pair of input/output terminal portions and is connected to input/output pads of the PCB to allow current flow through the PCB and parallel current flow.

The at least one current path portion may include one pair of current path portions spaced apart from each other and the at least one pair of input/output terminal portions may include two pairs of input/output terminal portions connected to ends of the one pair of current path portions.

The at least one FPCB may include one pair of FPCBs bonded to the at least one pair of input/output terminal portions disposed at both ends of the lead frame.

At least a part of junctions of the battery protection circuit elements mounted on the PCB may be underfilled with an epoxy and then is encapsulated by the molding material.

Other features and aspects will be apparent from the following detailed description, the drawings, and the claims.

Figure 1:
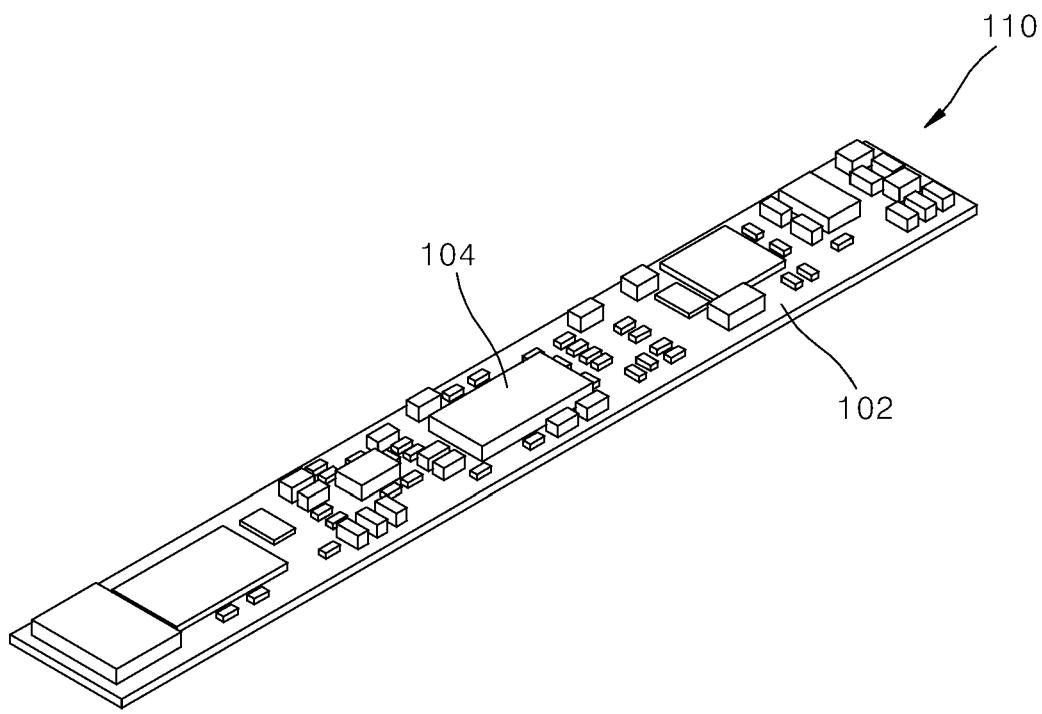
FIG. 1 is a schematic diagram illustrating a battery protection circuit package and a method of fabricating the same according to an embodiment of the present invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

REFERENCE NUMERALS

102: PCB
104: BATTERY PROTECTION CIRCUIT ELEMENT
112: PCB
114: METAL TAB
122: MOLDING MATERIAL
140: FPCB

DETAILED DESCRIPTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. Moreover, in the drawings, the dimensions of layers and regions may be exaggerated for clarity of illustration.

Throughout the specification, it will also be understood that when an element such as layer, region, or substrate is referred to as being "on", "connected to", "stacked" or "coupled with" another element, then the element can be directly on, connected to, stacked, or coupled with the other element, and/or intervening elements may be present. In contrast, when an element is referred to as being "directly on", "directly connected to", "directly stacked" or "directly coupled with" another element, it will be understood that there are no intervening elements. Like reference numerals denote like elements. As used herein the term "and/or" includes any and all combinations of one or more of the associated listed items.

Although the terms first, second, etc. may be used herein to describe various elements, components, regions, layers and/or sections, these elements, components, regions, layers and/or sections should not necessarily be limited by such terms. These terms are only used to distinguish one element, component, region, layer or section from another element, component, region, layer or section. Thus, a first element, component, region, layer, or section discussed below could be termed a second element, component, region, layer, or section without departing from the teachings of the present invention.

Furthermore, relative terms such as "below," "lower," "above," and "upper" may be used herein to describe one element's relationship to another element as illustrated in the accompanying drawings. Such relative terms are intended to encompass different orientations of illustrated technologies in addition to the orientation depicted in the accompanying drawings. For example, if a device in the accompanying drawings were turned over, then the elements described as being on the "lower" side of other elements would then be oriented on "upper" sides of the other elements. Similarly, if the device in one of the drawings were turned over, elements described as "below" or "beneath" other elements would then be oriented "above" the other elements. Therefore, the example terms "below" and "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

FIGS. 1 to 7 are schematic diagrams illustrating a battery protection circuit package and a method of fabricating the same according to an embodiment of the present invention.

Referring to FIG. 1, battery protection circuit elements 104 may be mounted on a printed circuit board (PCB) 102 to form a first mounting structure 110.

For example, the PCB 102 may include a structure which is a rigid substrate structure in which a circuit pattern is formed on a core structure. In addition, the PCB 102 may include via electrodes penetrating the inside thereof to electrically connect the battery protection circuit elements 104 mounted on an upper portion of the PCB 102 to a bottom portion. Furthermore, the PCB 102 may further include a wiring pattern or a pad pattern for rewiring the via electrodes.

The battery protection circuit elements 104 may include elements for protecting the battery during operation of the battery, for example, charging and discharging operation. For example, the battery protection circuit elements 104 may include at least one transistor, for example, a field effect transistor (FET), a protection integrated circuit (IC), and passive elements.

The protection IC may control the on/off operation of the FET to monitor the voltage and control the charging or discharging operation. For example, the protection IC may turn off the FET when the protection IC detects an overcurrent or an overdischarge state during a battery discharge process or detects an overcurrent or an overcharge state during a battery charge process. The passive elements may include at least one resistor and at least one capacitor.

For example, an operation of forming the first mounting structure 110 may include mounting the battery protection circuit elements 104 on the PCB 102 using a surface mounting technology (SMT). The SMT may refer to a technology of attaching parts to a surface of the PCB 102. Therefore, the battery protection circuit elements 104 may be attached to the circuit pattern on the surface of the PCB 102 using the SMT. For example, the battery protection circuit elements 104 may be attached to the circuit pattern on the surface of the PCB 102 using soldering technique.

Figure 2:
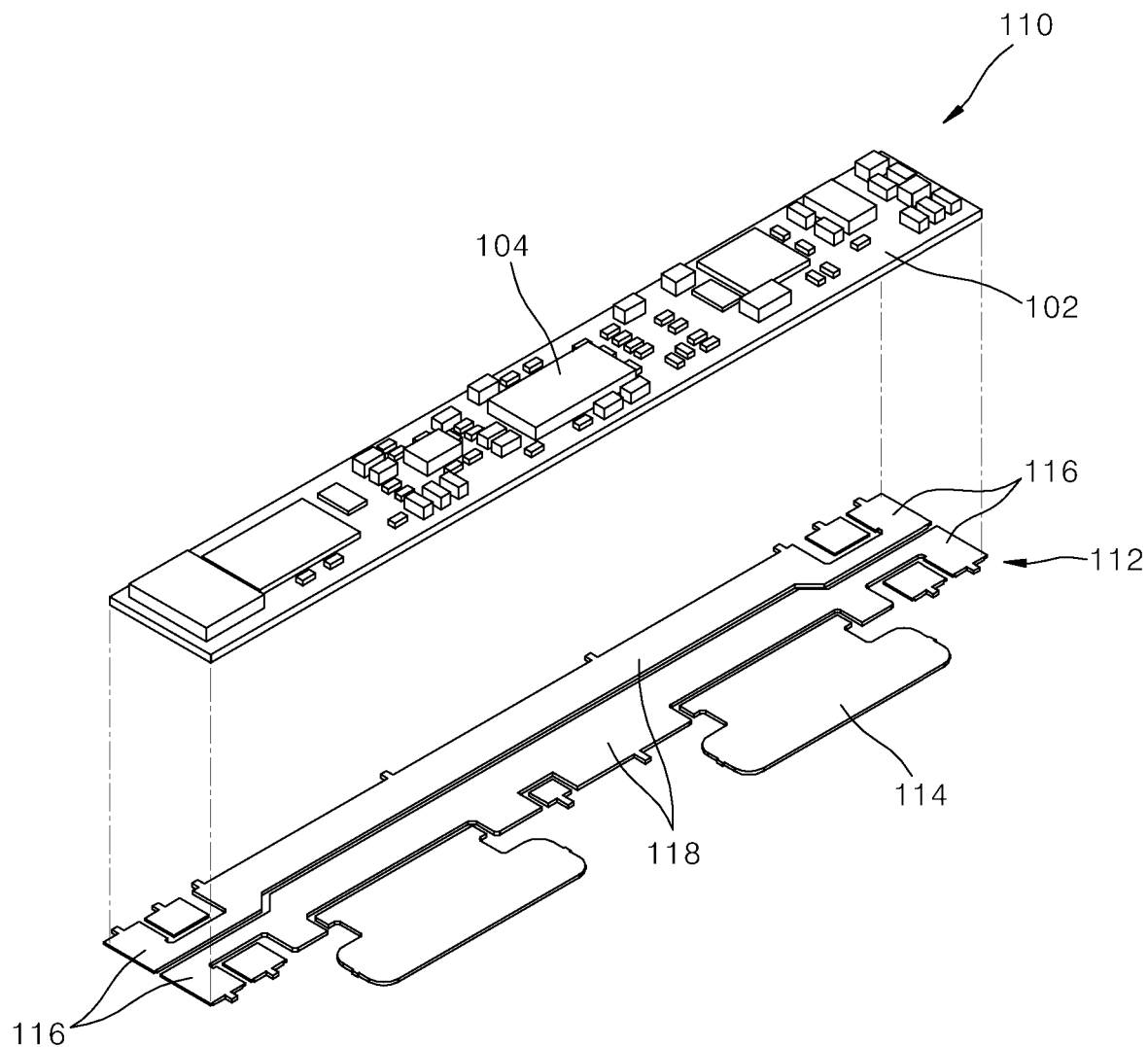
FIG. 2 is a schematic diagram illustrating a battery protection circuit package and a method of fabricating the same according to an embodiment of the present invention.
Figure 3:
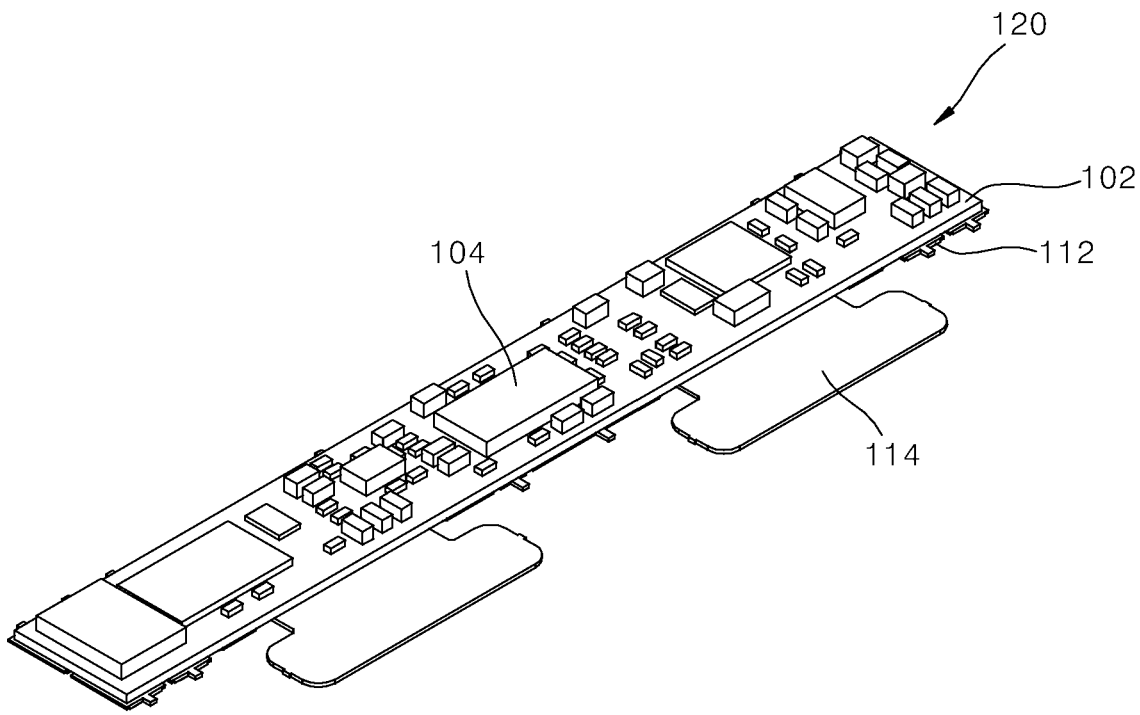
FIG. 3 is a schematic diagram illustrating a battery protection circuit package and a method of fabricating the same according to an embodiment of the present invention.

Referring to FIGS. 2 and 3, the first mounting structure 110 may be mounted on a lead frame 112 to form a second mounting structure 120.

After the first mounting structure 110 is disposed on the lead frame 112 having a metal tab 114 as shown in FIG. 2, the first mounting structure 110 may be mounted on the lead frame 112 using the SMT, as shown in FIG. 3. For example, the first mounting structure 110 may be attached to a surface of the lead frame 112 using a soldering technique. Thereafter, optionally, a deflux process may be added to remove solder flux.

In the present embodiment, the battery protection circuit elements 104 may not be directly connected to the lead frame 112, but may be mounted on the PCB 102 and then connected to the lead frame 112 through the PCB 102.

For example, the lead frame 112 may include an input/output terminal portion 116 for external connection and at least one metal tab 104 for battery cell connection. Furthermore, the input/output terminal portion 116 may include at least one pair of input/output terminal portions 116 disposed at both ends of the lead frame 112.

The lead frame 112 may include at least one current path portion 118 that extends in the longitudinal direction to connect the pair of input/output terminal portions 116 and is connected to the input/output pads of the PCB 102 to allow current flow through the PCB 102 and parallel current flow. Furthermore, a pair of current path portions 118 may be formed to be spaced apart from each other, and two pairs of input/output terminal portions 116 may be connected to ends of the pair of current path portions 118.

The input/output pads of the PCB 102 may be connected on the current path portions 118, and these input/output pads may be connected to each other through internal wiring of the PCB 102, and at the same time, connected in parallel through the current path portions 118 of the lead frame 112. This allows parallel current flow, which may reduce internal resistance.

For example, the metal tab 114 for battery cell connection may be formed to protrude from the side of the lead frame 112. Moreover, the lead frame 112 and the metal tab 114 may be integrally formed. For example, the lead frame 112 and the metal tab 114 may be formed of the same metal material, for example, copper (Cu) or nickel (Ni). The metal tab 114 may be used when the lead frame 112 is connected to an external device, and may be electrically connected to the external device through such a method as soldering, laser welding, or the like.

Figure 4:
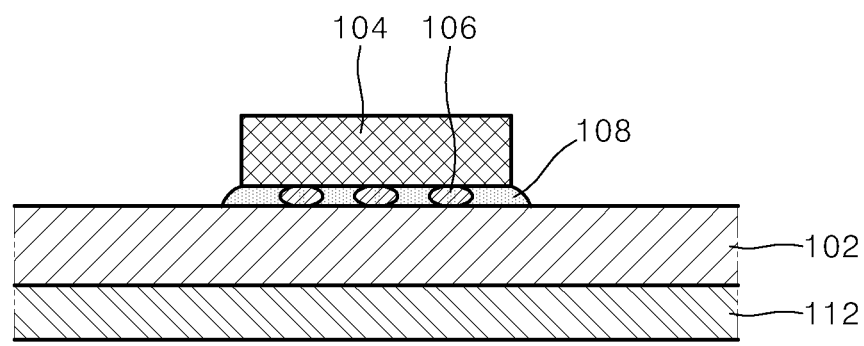
FIG. 4 is a schematic diagram illustrating a battery protection circuit package and a method of fabricating the same according to an embodiment of the present invention.

FIG. 4 is a partial cross-sectional view of the second mounting structure 120 for showing a fabrication process in accordance with some embodiments of the present invention.

Referring to FIG. 4, before encapsulation of the second mounting structure 120, an operation of underfilling at least a part of junctions of the battery protection circuit elements 104 mounted on the PCB 102 may be provided.

For example, an underfill process may be performed by filling an epoxy 108 between the battery protection circuit elements 104 and the PCB 112 so as to cover solders 106 that bond the battery protection circuit elements 104 and the PCB 102. For example, an underfill process may be performed with the epoxy 108 to cover the field effect transistor (FET) and the solders 106 of the protection integrated circuit among the battery protection devices 104.

Through the underfill process, bonding reliability between the battery protection circuit elements 104 and the PCB 112 may be increased, and furthermore, defects, such as cracks, may be prevented.

Figure 5:
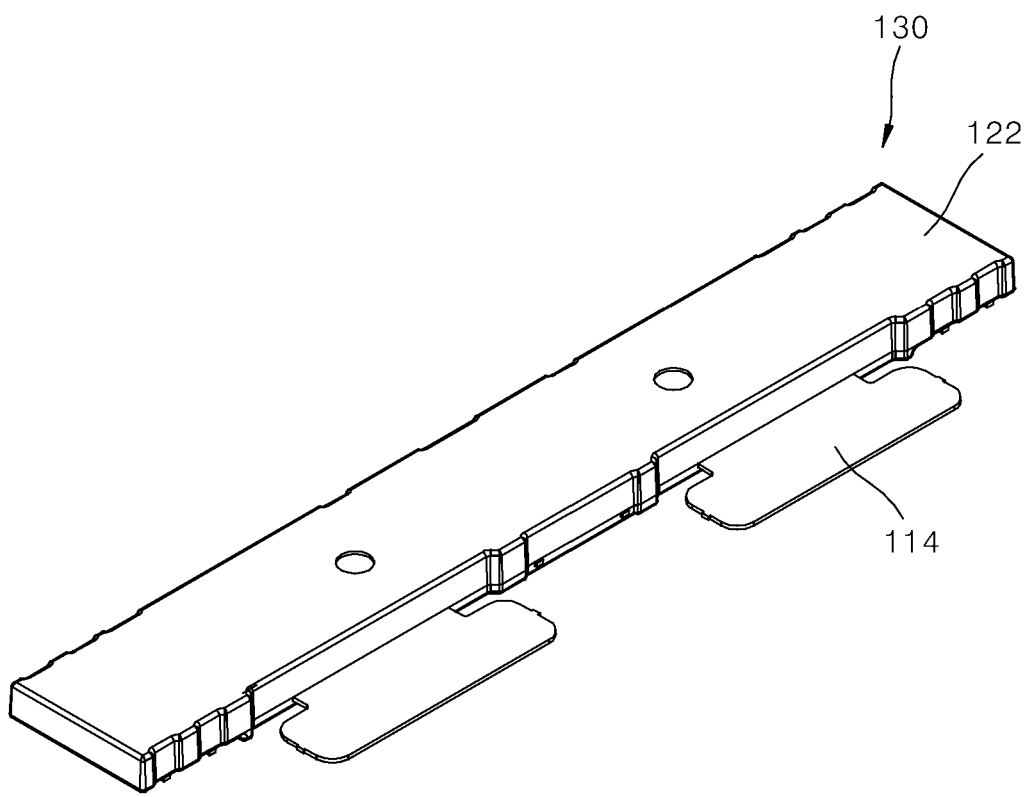
FIG. 5 is a schematic diagram illustrating a battery protection circuit package and a method of fabricating the same according to an embodiment of the present invention.

Referring to FIG. 5, at least a part of the battery protection circuit elements 104 may be encapsulated with a molding material 122 to form a encapsulation structure 130.

For example, a encapsulation structure may be formed by encapsulating the second mounting structure 120 with a molding material to encapsulate at least a part of the battery protection circuit elements 104 while exposing the input/output terminal portion 116 and the metal tab 114 of the lead frame 112.

For example, the molding material 122 may cover the exposed portions of the battery protection circuit elements and further cover the side surfaces of the PCB 102 and the lead frame 112. Furthermore, the molding material 122 may cover a part of a lower surface of the lead frame 112.

For example, the molding material 122 may be formed of an epoxy molding compound (EMC) using such a method as transfer molding or insert molding.

Optionally, an electrical specification test may be conducted on the molding structure 130 to verify the reliability.

Figure 6:
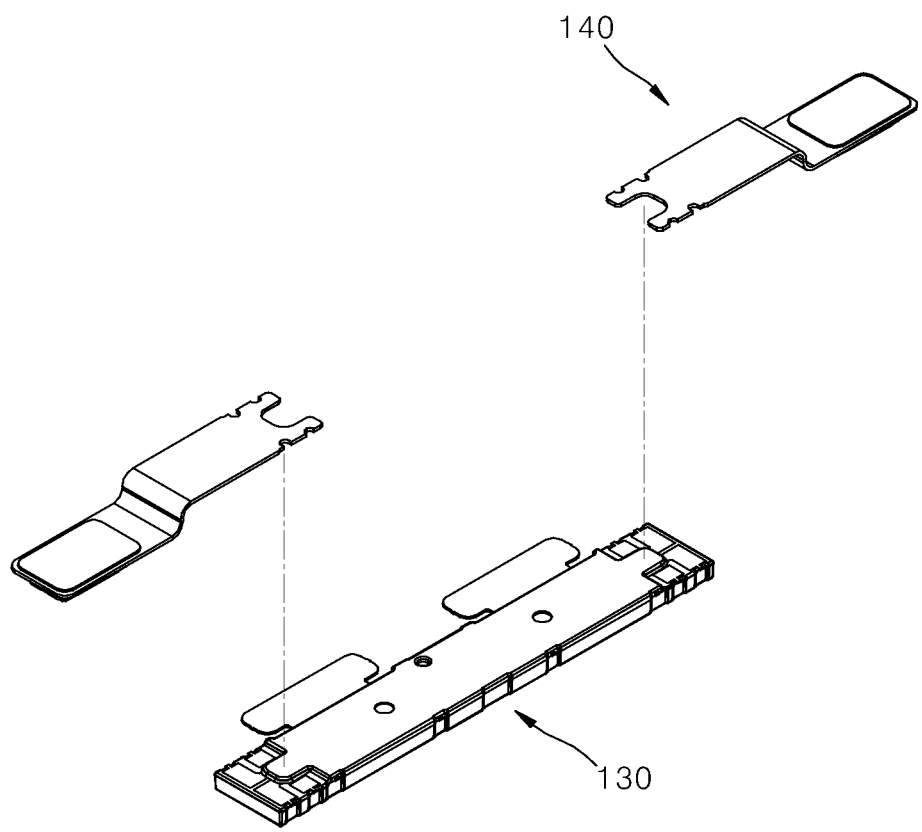
FIG. 6 is a schematic diagram illustrating a battery protection circuit package and a method of fabricating the same according to an embodiment of the present invention.
Figure 7:
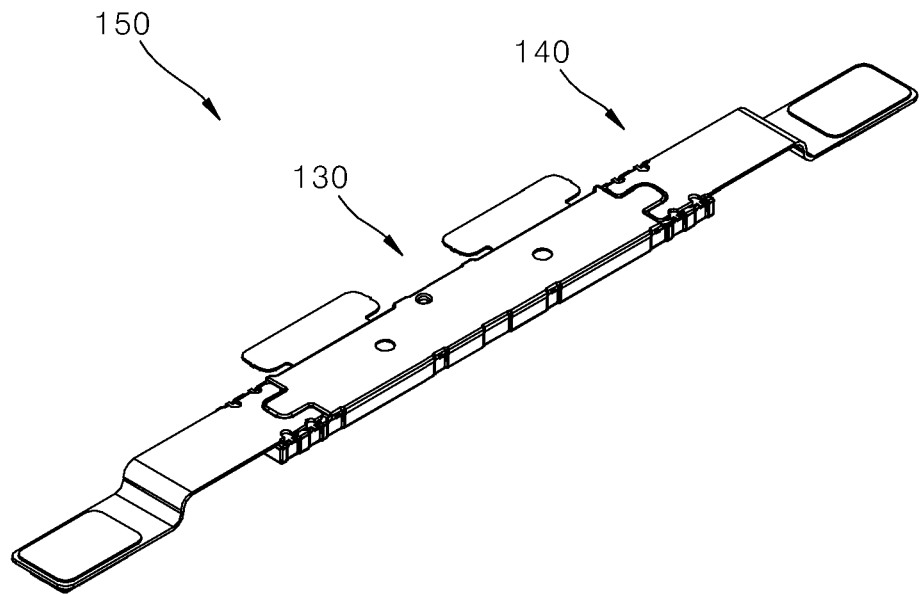
FIG. 7 is a schematic diagram illustrating a battery protection circuit package and a method of fabricating the same according to an embodiment of the present invention.

Referring to FIGS. 6 to 7, an operation of bonding at least one flexible printed circuit board (FPCB) 140 to the encapsulation structure 130 may follow.

For example, as shown in FIG. 6, a pair of FPCBs 140 may be disposed on the exposed input/output terminal portions 116 of the encapsulation structure 130. More specifically, the FPCBs 140 may be disposed on the input/output terminal portions 116 on a lower surface of both ends of the lead frame 112 exposed from a encapsulating material 122 in the encapsulation structure 130 and may be bonded on the input/output terminal portions 116 of the lead frames 112 using an SMT to form a battery protection circuit package 150.

Optionally, an insulating coating may follow to insulate a solder exposed portions of the FPCBs 140.

Optionally, an electrical specification test may be added and be followed by a packing operation.

Figure 8:
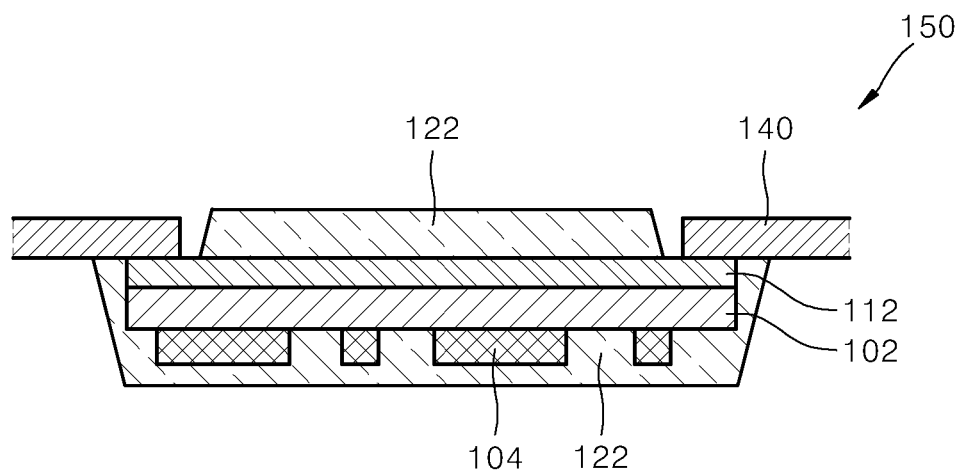
FIG. 8 is a schematic cross-sectional view showing a battery protection circuit package according to an embodiment of the present invention.

FIG. 8 is a schematic cross-sectional view showing a battery protection circuit package 150 according to an embodiment of the present invention.

Referring to FIG. 8, the battery protection circuit package 150 may include a lead frame 112 including an input/output terminal portion 116 for external connection and at least one metal tab 114 for battery cell connection, a PCB 102 mounted on the lead frame 112, battery protection circuit elements 104 mounted on the PCB 102, a molding material 122 encapsulating at least a part of the battery protection circuit elements 104, and at least one FPCB 140 bonded to the lead frame 112.

As described above, a pair of FPCBs 140 may be bonded on the input/output terminal portions 116 exposed from the molding material 122 at both ends of the lead frame 112.

According to embodiments of the present invention, since the PCB 102 is mounted directly on the lead frame 112 without being directly connected to the outside, the PCB 102 may be made thinner than the conventional PCB. For example, a signal transmission pattern and a component pad may be configured on the PCB 102, and a power pattern may be configured on the lead frame 112.

According to this structure, it is possible to separate the rigid PCB 102 and the FPCB 112 and to minimize the thickness of the PCB 102, thereby reducing fabrication costs.

In addition, when compared to the existing technology using a rigid FPCB, the rigid PCB 102 and the FPCB 112 are separated from each other and the metal lead frame 112 is used so that thermal conductivity is increased, thereby improving heat radiation properties.

Further, low resistance may be realized by utilizing the metal lead frame 112 as a power pattern and using it as a parallel current path, thereby providing high-speed operation characteristics, such as high-speed charging characteristics.

According to some embodiments of the present invention made as described above, a battery protection circuit package capable of high-speed operation and superior in heat radiation properties and a method of fabricating the same may be provided. It is apparent that the scope of the present invention is not limited to the effects described above.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of fabricating a battery protection circuit package, the method comprising:
    forming a first mounting structure by mounting battery protection circuit elements on a printed circuit board (PCB);
    forming a second mounting structure by mounting the first mounting structure on a lead frame which comprises an input/output terminal portion for external connection and at least one metal tab for battery cell connection;
    forming an encapsulation structure by encapsulating the second mounting structure with a molding material to encapsulate at least a part of the battery protection circuit elements while exposing the input/output terminal portion and the at least one metal tab of the lead frame; and
    bonding at least one flexible printed circuit board (FPCB) to the input/output terminal portion of the encapsulation structure.

2. The method of claim 1, wherein the forming of the first mounting structure comprises mounting the battery protection circuit elements on the PCB using a surface mounting technology (SMT).

3. The method of claim 1, wherein the at least one metal tab comprises at least one metal tap formed to protrude from a side of the lead frame.

4. The method of claim 3, wherein the lead frame and the at least one metal tab are integrally formed.

5. The method of claim 4, wherein the lead frame and the at least one metal tab are made of copper (Cu) or nickel (Ni).

6. The method of claim 1, wherein the input/output terminal portion comprises at least one pair of input/output terminal portions disposed at both ends of the lead frame and the lead frame may further include at least one current path portion that extends in a longitudinal direction to connect the pair of input/output terminal portions and is connected to input/output pads of the PCB to allow current flow through the PCB and parallel current flow.

7. The method of claim 6, wherein the at least one current path portion comprises one pair of current path portions spaced apart from each other and the at least one pair of input/output terminal portions comprise two pairs of input/output terminal portions connected to ends of the one pair of current path portions.

8. The method of claim 1, wherein the forming of the second mounting structure comprises mounting the first mounting structure on the lead frame using an SMT.

9. The method of claim 1, further comprising, prior to the encapsulating, underfilling at least a part of junctions of the battery protection circuit elements mounted on the PCB with an epoxy.

10. The method of claim 1, wherein the bonding comprises bonding a pair of FPCBs to both ends of the lead frame of the second mounting structure.

11. The method of claim 1, further comprising, after the bonding, bending at least a part of the FPCB.

12. A battery protection circuit package comprising:
    a lead frame configured to comprise an input/output terminal portion for external connection and at least one metal tab for battery cell connection;
    a printed circuit board (PCB) mounted on the lead frame;
    battery protection circuit elements mounted on the PCB;
    a molding material configured to encapsulate at least a part of the battery protection circuit elements while exposing the input/output terminal portion and the at least one metal tab of the lead frame; and
    at least one flexible printed circuit board (FPCB) bonded to the input/output terminal portion of the lead frame.

13. The battery protection circuit package of claim 12, wherein the input/output terminal portion comprises at least one pair of input/output terminal portions disposed at each ends of the lead frame and the lead frame may further include at least one current path portion which extends in a longitudinal direction to connect the one pair of input/output terminal portions and is connected to input/output pads of the PCB to allow current flow through the PCB and parallel current flow.

14. The battery protection circuit package of claim 13, wherein the at least one current path portion comprises one pair of current path portions spaced apart from each other and the at least one pair of input/output terminal portions comprise two pairs of input/output terminal portions connected to ends of the one pair of current path portions.

15. The battery protection circuit package of claim 13, wherein the at least one FPCB comprises one pair of FPCBs bonded to the at least one pair of input/output terminal portions disposed at both ends of the lead frame.

16. The battery protection circuit package of claim 12, wherein at least a part of junctions of the battery protection circuit elements mounted on the PCB is underfilled with an epoxy and then is encapsulated by the molding material.

\* \* \* \* \*